United States Patent
Baur et al.

(10) Patent No.: US 7,115,907 B2
(45) Date of Patent: Oct. 3, 2006

(54) RADIATION-EMITTING SEMICONDUCTOR COMPONENT

(75) Inventors: Johannes Baur, Laaber (DE); Dominik Eisert, Regensburg (DE); Michael Fehrer, Bad Abbach (DE); Berthold Hahn, Hemau (DE); Andreas Ploessl, Regensburg (DE); Wilhelm Stein, Donaustauf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/528,852

(22) PCT Filed: Sep. 22, 2003

(86) PCT No.: PCT/DE03/03147

§ 371 (c)(1),
(2), (4) Date: Oct. 18, 2005

(87) PCT Pub. No.: WO2004/030108

PCT Pub. Date: Apr. 8, 2004

(65) Prior Publication Data

US 2006/0071224 A1 Apr. 6, 2006

(30) Foreign Application Priority Data

Sep. 23, 2002 (DE) ................. 102 44 200

(51) Int. Cl.
*H01L 27/15* (2006.01)
*H01L 29/24* (2006.01)
*H01L 29/20* (2006.01)

(52) U.S. Cl. ............... 257/79; 257/84; 257/88; 257/89; 257/101; 257/103

(58) Field of Classification Search .............. None
See application file for complete search history.

(56) References Cited

U.S. PATENT DOCUMENTS

| 5,602,418 | A | 2/1997 | Imai et al. |
| 6,291,839 | B1 | 9/2001 | Lester |
| 6,410,939 | B1 * | 6/2002 | Koide et al. .............. 257/79 |
| 6,831,309 | B1 * | 12/2004 | Giboney .............. 257/184 |
| 2004/0056254 | A1 | 3/2004 | Bader et al. |

FOREIGN PATENT DOCUMENTS

| DE | 692 30 260 T2 | 11/1999 |
| DE | 199 27 945 A1 | 3/2000 |
| DE | 100 17 336 A | 10/2001 |
| DE | 100 26 254 A1 | 11/2001 |
| EP | 0 064 777 A1 | 3/1982 |

(Continued)

OTHER PUBLICATIONS

Minamino et al., "Amorphous Si solar cell on ceramic substrate", IEEE Photovoltaic Specialists Conf., Bd. vol. 1, pp. 229-234, May 1, 1984.

(Continued)

*Primary Examiner*—Jasmine Clark
(74) *Attorney, Agent, or Firm*—Cohen, Pontani, Lieberman & Pavane

(57) ABSTRACT

A radiation-emitting semiconductor component with a layer structure (12) which includes a photon-emitting active layer (16), an n-doped cladding layer (14) and a p-doped cladding layer (18), a contact connected to the n-doped cladding layer (14) and a mirror layer (20) connected to the p-doped cladding layer (18). The mirror layer (20) is formed by an alloy of silver comprising one or more metals selected from the group consisting of Ru, Rh, Pd, Au, Os, Ir, Pt, Cu, Ti, Ta and Cr.

16 Claims, 2 Drawing Sheets

FOREIGN PATENT DOCUMENTS

| | | |
|---|---|---|
| EP | 0 607 435 A | 7/1994 |
| EP | 1 168 460 A | 1/2002 |
| JP | 11 150302 A | 6/1999 |
| JP | 11 220168 A | 8/1999 |
| WO | WO 01/47038 A | 6/2001 |
| WO | WO 01/47039 A | 6/2001 |

OTHER PUBLICATIONS

I. Schnitzer, et al., "30% external quantum efficiency from surface textured, thin-film light-emitting diodes", Appl. Phys. Lett 63 (16), pp. 2174-2176, Oct. 18, 1993.

* cited by examiner

RADIATION-EMITTING SEMICONDUCTOR COMPONENT

RELATED APPLICATIONS

This is a U.S. national stage of application No. PCT/DE2003/003 147, filed on 22 Sep. 2003.

This patent application claims the priority of German patent application No. 102 44 200.2 filed 23 Sep. 2002, the disclosure content of which is hereby incorporated by reference.

FIELD OF THE INVENTION

The invention relates to a radiation-emitting semiconductor component and in particular, to such a component with an improved mirror layer to increase the efficiency and performance of the component.

BACKGROUND OF THE INVENTION

Radiation-emitting semiconductor components, such as for example InGaN-based top-down mounted luminescence diodes or thin-film luminescence diodes require highly reflective mirror materials which reflect radiation emitted from the active zone toward the component rear side back toward the front side or toward the component flanks.

In the case of top-down mounted luminescence diodes, the radiation-generating epitaxial layer sequence faces toward the mounting side, i.e. the component radiates through the growth substrate if still present. In the case of thin-film luminescence diodes, the growth substrate used for the epitaxial growth of the radiation-generating epitaxial layer sequence is at least partially removed and the epitaxial layer sequence is located on a carrier substrate applied subsequently.

Furthermore, for luminescence diodes based on nitride III–V compound semiconductor material, in particular based on GaN, such as AlGaN, InGaN and InGaAlN, and also GaN itself, the mirror materials are to form an ohmic contact with the p-doped layer of the layer structure.

The problem in this context is that metals of good reflective properties in the blue spectral region, such as aluminum, do not form an ohmic contact on p-GaN or related materials, such as p-AlGaN, p-InGaN and p-InGaAlN. On the other hand, materials which form a good contact on p-GaN, such as for example platinum or palladium, have an adsorbing action in the blue spectral region and are therefore not suitable for use as mirror material. Only silver is both sufficiently reflective and suitable for the contact-connection of p-GaN, etc. However, the drawback in this case is that the mechanical stability of silver layers is insufficient for use in luminescence diodes.

The group of radiation-emitting components based on nitride III–V compound semiconductor material in the present case include in particular chips in which the epitaxially produced semiconductor layer, which typically includes a layer sequence composed of various individual layers, includes at least one individual layer which comprises a material from the nitride III–V compound semiconductor material system $In_xAl_yGa_{1-x-y}N$, with $0 \leq x \leq 1$, $0 \leq y \leq 1$ and $x+y \leq 1$. The semiconductor layer may, for example, have a conventional pn junction, a double heterostructure, a single quantum well structure (SQW structure) or a multiple quantum well structure (MQW structure). Structures of this type are known to the person skilled in the art and are therefore not explained in more detail at this point.

The choice of mirror material is also difficult in the case of short-wave thin-film luminescence diodes based on InGaAlP. Gold, which is often used as mirror material at present, limits the efficiency of these diodes, on account of its relatively low reflectivity. Silver, which is more suitable in terms of reflectivity, has not hitherto been used, on account of its poor bonding and on account of migration problems.

One approach aimed at eliminating these difficulties consists in using aluminum mirrors, in which the electrical terminal is formed by a platinum layer and the optical properties are provided by the aluminum. Alternatively, it is possible to deposit silver which is fixed to a side facing away from the wafer by further metals.

SUMMARY OF THE INVENTION

One object of the present invention is to provide a radiation-emitting semiconductor component having an improved mirror layer to thereby increase the efficiency and performance of the component.

This and other objects are attained in accordance with one aspect of the present invention directed to a radiation-emitting semiconductor component, having a layer structure which includes at least one photon-emitting active zone arranged between a cladding layer that is n-conductively doped and a cladding layer that is p-conductively doped. An n-type contact is connected to the cladding layer that is n-conductively doped, and a mirror layer is arranged on the side, facing away from the active zone, of the cladding layer that is p-conductively doped. The mirror layer is formed by an alloy of silver with one or more metals selected from the group consisting of Ru, Os, Ir, Cu, Ti, Ta and Cr.

According to an embodiment of the invention, in a radiation-emitting semiconductor component of the generic type, the mirror layer is formed by an alloy of silver with one or more metals selected from the group consisting of Ru, Rh, Pd, Au, Os, Ir, Pt, Cu, Ti, Ta and Cr. The addition of these metals makes it possible to significantly improve the mechanical properties of silver layers without reducing the reflectivity of the layer compared to pure silver. At the same time, the diffusion of silver into the adjoining semiconductor layer is reduced.

In one configuration of the radiation-emitting semiconductor component according to an aspect of the invention, the mirror layer is formed by an alloy of silver with one or more metals selected from the group consisting of Ru, Rh, Pd, Au, Os, Ir, Pt and one or more metals selected from the group consisting of Cu, Ti, Ta, Cr. Ternary alloys of this nature have both a high reflectivity in the desired short-wave spectral region and a sufficient mechanical stability.

The mirror layer can be formed by an Ag-Pt-Cu alloy. This alloy combines a high reflectivity in the blue spectral region with a high mechanical and thermal stability.

The alloy of the silver layer, in addition to silver, can comprise a total of 0.1% by weight to 15% by weight, preferably 1% by weight to 5% by weight, of the above-mentioned metals.

In one refinement of the radiation-emitting semiconductor component, it is provided that the alloy of the mirror layer, in addition to silver, comprises 0.5 to 5% by weight of one or more metals selected from the group consisting of Ru, Rh, Pd, Au, Os, Ir, Pt and 0.5 to 5% by weight of one or more metals selected from the group consisting of Cu, Ti, Ta, Cr.

In this context, the alloy of the mirror layer of the radiation-emitting semiconductor component comprises in particular, in addition to silver, 1 to 3% by weight of platinum and 1 to 3% by weight of copper.

In an expedient refinement of the invention, the mirror layer forms an ohmic contact with the p-doped cladding layer, so that the mirror layer can simultaneously perform the function of a p-contact layer.

The configuration of the mirror layer according to the invention is particularly suitable for use in radiation-emitting semiconductor chips, in particular thin-film light-emitting diode chips, in which the radiation-generating layer structure is based on InGaAlN or InGaAlP. In particular, ohmic contacts can be produced using silver-containing alloys for InGaAlN-based luminescence diodes. Therefore, the mirror metallization can be produced directly above a light-generating layer.

A thin-film light-emitting diode chip can include the following features:
- a reflective layer is applied to or formed on a first main surface, facing a carrier element, of a radiation-generating epitaxial layer sequence, the reflective layer reflecting at least some of the electromagnetic radiation generated in the epitaxial layer sequence back into the latter;
- the epitaxial layer sequence has a thickness in the range of 20 μm or below, in particular in the region of 10 μm; and
- the epitaxial layer sequence includes at least one semiconductor layer with at least one surface which has a mixed structure which ideally leads to an approximately ergodic distribution of the light in the epitaxial layer sequence, i.e. it has as far as possible ergodically stochastic scattering properties.

A basic principle of a thin-film light-emitting diode chip is described, for example, in I. Schnitzer et al., Appl. Phys. Lett. 63 (16), Oct. 18, 1993, 2174–2176, the content of disclosure in this respect is hereby incorporated by reference.

A thin-film light-emitting diode chip is, to a close approximation, a Lambert radiator and is therefore particularly suitable for use in a headlamp.

In the present context, the term "radiation-generating layer structure based on InGaAlP" means that a layer structure designated as such or part of a layer structure of this type preferably comprises $Al_nGa_mIn_{1-n-m}P$ where $0 \leq n \leq 1$, $0 \leq m \leq 1$ and $n+m \leq 1$. This material does not necessarily have to have a precise mathematical composition in accordance with the above formula. Rather, it may also include one or more dopants and additional constituents which leave the physical properties of the material substantially unchanged.

In the present context, the term "radiation-generating layer structure based on InGaAlN" means that a layer structure designated as such or part of a layer structure of this type preferably comprises $Al_nGa_mIn_{1-n-m}N$, where $0 \leq n \leq 1$, $0 \leq m \leq 1$ and $n+m \leq 1$. This material does not necessarily have to have a mathematical composition precisely in accordance with the above formula. Rather, it may include one or more dopants and additional constituents which leave the physical properties of the material substantially unchanged.

DETAILED DESCRIPTION OF THE DRAWINGS

Figure 1:
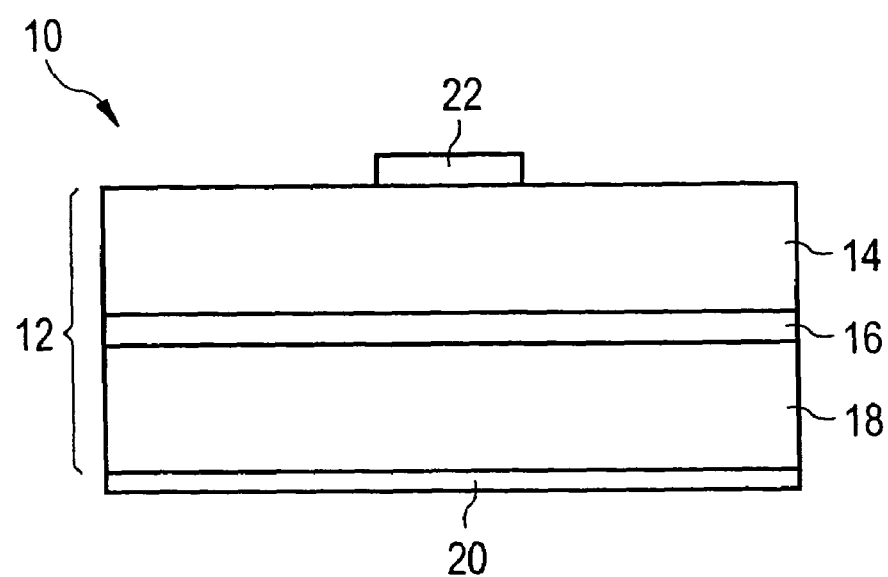
FIG. 1 shows a diagrammatic sectional illustration of a radiation-emitting semiconductor component in accordance with an exemplary embodiment of the invention.

FIG. 1 shows a diagrammatic sectional illustration of an InGaN luminescence diode 10 which emits in the blue spectral region. The luminescence diode 10 includes a layer structure 12 comprising an n-doped cladding layer 14, a photon-emitting active layer 16 and a p-doped cladding layer 18.

An n-contact 22 is arranged on the n-doped cladding layer 14 for the purpose of supplying current. In the exemplary embodiment, the p-contact is formed by the p-contact layer 20, which simultaneously forms a highly reflective mirror layer which reflects the component of the radiation generated by the active layer 16 in the direction of the mirror layer.

In the exemplary embodiment, the mirror layer 20 includes an AgPtCu alloy containing silver, and approximately 1.5% by weight of platinum and approximately 1.5% by weight of copper. The alloy can have other ingredients, such as one or more of the metals Ru, Rh. Pd. Au. Os. Ir. Pt. Cu. Ti. Ta and Cr. The ingredients are not limited to metals. For example, the alloy could include a semiconductor material if the physical properties of the alloy, such as mechanical stability, reflectivity or ability to form an ohmic contact are not unacceptably deteriorated by the addition of such a material. This alloy on the one hand forms a good ohmic contact with the cladding layer 18 made of, for example, p-GaN. Furthermore, the addition of platinum and copper to silver significantly improves the mechanical properties of the silver layer. The high reflectivity of the mirror layer in the blue spectral region is retained. Furthermore, there is scarcely any diffusion of silver atoms out of the AgPtCu layer 20 into the p-doped cladding layer 18, and as a result a highly reflective, stable p-contact layer is obtained.

A mirror layer of this type formed from an AgPtCu alloy is furthermore also suitable for use in InGaAlP thin-film luminescence diodes, where, as a highly reflective and thermally stable metal mirror, it contributes to increasing the efficiency of the LEDs.

Alternatively, the mirror layer may include an AgPtRhCu alloy, an AgPtCuTi alloy or an AgPtRhCuTi alloy or another of the advantageous alloys mentioned above.

Figure 2:
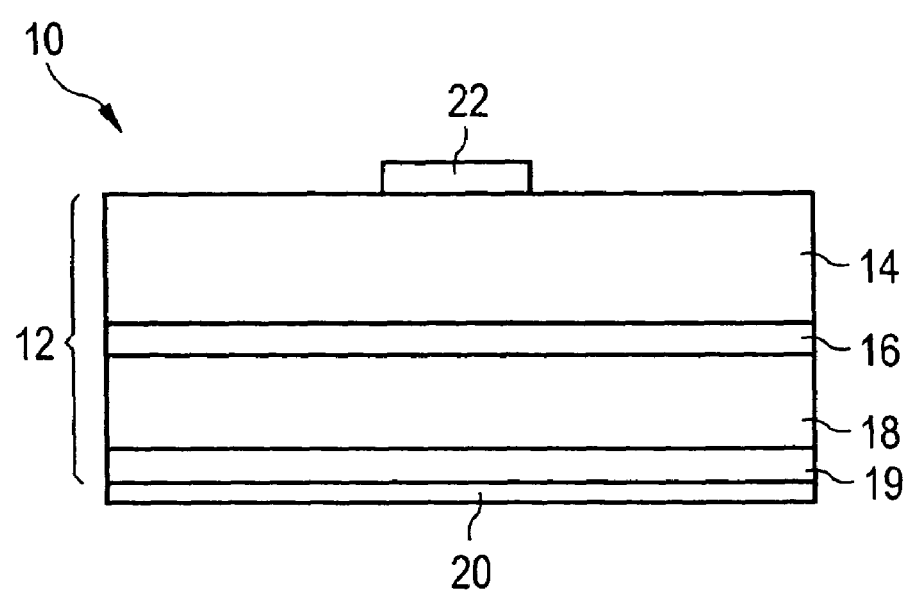
FIG. 2 shows a second embodiment of the invention

FIG. 2 shows the same diagrammatic sectional illustration of an InGaN luminescence diode as depicted in FIG. 1. However, FIG. 2 also shows a p-doped layer 19 between the p-doped cladding layer 18 and the mirror layer 20.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A radiation-emitting semiconductor component, having a layer structure (12) which includes at least one photon-emitting active zone (16) arranged between a cladding layer (14) that is n-conductively doped and a cladding layer (18) that is p-conductively doped,
   an n-type contact connected to the cladding layer (14) that is n-conductively doped, and
   a mirror layer (20) arranged on the side, facing away from the active zone (16), of the cladding layer (18) that is p-conductively doped, wherein
the mirror layer (20) is formed by an alloy of silver comprising one or more metals selected from the group consisting of Ru, Os, Ir, Cu, Ti, Ta and Cr.

2. The radiation-emitting semiconductor component as claimed in claim 1, wherein the mirror layer (20) is formed by an alloy of silver comprises one or more metals selected from the group consisting of Ru, Rh, Pd, Au, Os, Ir, Pt and one or more metals selected from the group consisting of Cu, Ti, Ta, Cr.

3. The radiation-emitting semiconductor component as claimed in claim 1, wherein the mirror layer (20) is formed by an alloy of silver comprising a metal selected from the group consisting of Ru, Rh, Pd, Au, Os, Ir, Pt and one or more metals selected from the group consisting of Cu, Ti, Ta, Cr.

4. The radiation-emitting semiconductor component as claimed in claim 1, wherein the mirror layer (20) is formed by an alloy of silver comprising one or more metals selected from the group consisting of Ru, Rh, Pd, Au, Os, Ir, Pt and a metal selected from the group consisting of Cu, Ti, Ta, Cr.

5. The radiation-emitting semiconductor component as claimed in claim 1, wherein the mirror layer (20) is formed by an alloy of silver comprising a metal selected from the group consisting of Ru, Rh, Pd, Au, Os, Ir, Pt and a metal selected from the group consisting of Cu, Ti, Ta, Cr.

6. The radiation-emitting semiconductor component as claimed in claim 1, wherein the mirror layer (20) is formed by an Ag—Pt—Cu alloy.

7. The radiation-emitting semiconductor component as claimed in claim 1, wherein the alloy of the mirror layer (20), in addition to silver, comprises a total of 0.1% by weight to 15% by weight, said metals.

8. The radiation-emitting semiconductor component as claimed in claim 2, wherein the alloy of the mirror layer (20), in addition to silver, comprises 0.5 to 5% by weight of one or more metals selected from the group consisting of Ru, Rh, Pd, Au, Os, Ir, Pt and 0.5 to 5% by weight of one or more metals selected from the group consisting of Cu, Ti, Ta, Cr.

9. The radiation-emitting semiconductor component as claimed in claim 6, wherein the alloy of the silver layer (20), in addition to silver, comprises 1 to 3% by weight of platinum and 1 to 3% by weight of copper.

10. The radiation-emitting semiconductor component as claimed in claim 1, wherein the mirror layer (20) forms an ohmic contact either with the cladding layer (18) that is p-conductively doped or with a further semiconductor layer that is p-conductively doped and is arranged between the mirror layer and the cladding layer (18) that is p-conductively doped.

11. The radiation-emitting semiconductor component as claimed in claim 1, wherein the layer structure (12) is based on nitride III–V compound semiconductor material.

12. The radiation-emitting semiconductor component as claimed in claim 11, wherein the layer structure (12) is based on InGaAlN.

13. The radiation-emitting semiconductor component as claimed in claim 1, wherein the layer structure (12) is based on phosphide III–V compound semiconductor material.

14. The radiation-emitting semiconductor component as claimed in claim 13, wherein the layer structure (12) is based on InGaAlP.

15. The radiation-emitting semiconductor component as claimed in claim 1, wherein the alloy of the mirror layer (20), in addition to silver, comprises a total of 1% by weight to 5% by weight of said metals.

16. The radiation-emitting semiconductor component as claimed in claim 1, wherein the mirror layer comprises a ternary alloy of silver.

* * * * *